United States Patent [19]

Wohlert et al.

[11] Patent Number: 4,951,014
[45] Date of Patent: Aug. 21, 1990

[54] HIGH POWER MICROWAVE CIRCUIT PACKAGES

[75] Inventors: Albert C. Wohlert, Townsend; H. Barteld Van Rees, Newton Upper Falls, both of Mass.

[73] Assignee: Raytheon Company, Lexington, Mass.

[21] Appl. No.: 358,279

[22] Filed: May 26, 1989

[51] Int. Cl.$^5$ .............................................. H01P 1/00
[52] U.S. Cl. ..................... 333/246; 333/247
[58] Field of Search ................ 333/246, 247; 357/75, 357/81

[56] References Cited

U.S. PATENT DOCUMENTS

| | | | |
|---|---|---|---|
| 3,825,805 | 7/1974 | Belohoubeck et al. | 333/247 X |
| 3,943,556 | 3/1976 | Wilson | 333/247 X |
| 3,958,195 | 5/1976 | Johnson | 333/247 |
| 4,617,586 | 10/1986 | Cuvilliers et al. | 333/247 X |
| 4,835,065 | 5/1989 | Sato et al. | 357/67 X |

Primary Examiner—Paul Gensler
Attorney, Agent, or Firm—Denis G. Maloney; Richard M. Sharkansky

[57] ABSTRACT

A carrier for high power solid state devices in particular monolithic microwave integrated gallium arsenide circuits includes a dielectric carrier surface comprised of aluminum nitride having disposed over a first surface thereof, a plated ground plane conductor and having disposed over a second surface thereof a ground plane conductor disposed in selected regions of said second surface, connected to the underlying ground plane conductor by via holes. The aluminum nitride carrier provides a dielectric for transmission lines which are supported by said carrier, and a support for resistor and capacitor devices formed over said carrier by thin film techniques. A high power active device such as a FET or gallium arsenide MMIC is bonded to the selective ground plane regions of the second surface of the aluminum nitride carrier. With this approach, a separate metal carrier having separately mounted components such as resistors, capacitors, and transmission lines is eliminated. The techniqu provides improvement in thermal resistance characteristics of the microwave circuit supported by the carrier and simplifies the packaging of such devices.

8 Claims, 4 Drawing Sheets

HIGH POWER MICROWAVE CIRCUIT PACKAGES

BACKGROUND OF THE INVENTION

This invention relates generally to microwave circuits and more particularly to microwave circuit packaging techniques.

As is known in the art, microwave systems have made extensive use of discrete resistors, capacitors, inductors, and active devices, as well as, integrated circuits such as monolithic microwave integrated circuits (MMIC) to provide microwave sub-assemblies for both low power and high power applications.

In low power microwave circuits, an aluminum oxide ($Al_2O_3$) carrier is provided to carry all the individual microwave components. Such components include low power MMIC components, as well as, discrete capacitors and resistors which may be used to provide bias to the circuits. The $Al_2O_3$ carrier is generally also mounted to a base portion of a microwave package. At low power levels, typically less than 0.3 watts power dissipation, the relatively poor thermal conductivity of aluminum oxide does not significantly degrade the operation of the microwave circuit so that the aluminum oxide substrate may be used to carry the circuit.

With high power circuits, however, (i.e. those circuits having a power dissipation greater than 0.3 watts), the relatively poor thermal conductivity of aluminum oxide makes it unacceptable as a carrier for the circuit. The approach in the prior art, therefore, is to use a precision machined slab of a thermally conductive metal as the carrier for the high power circuit.

Figure 1:
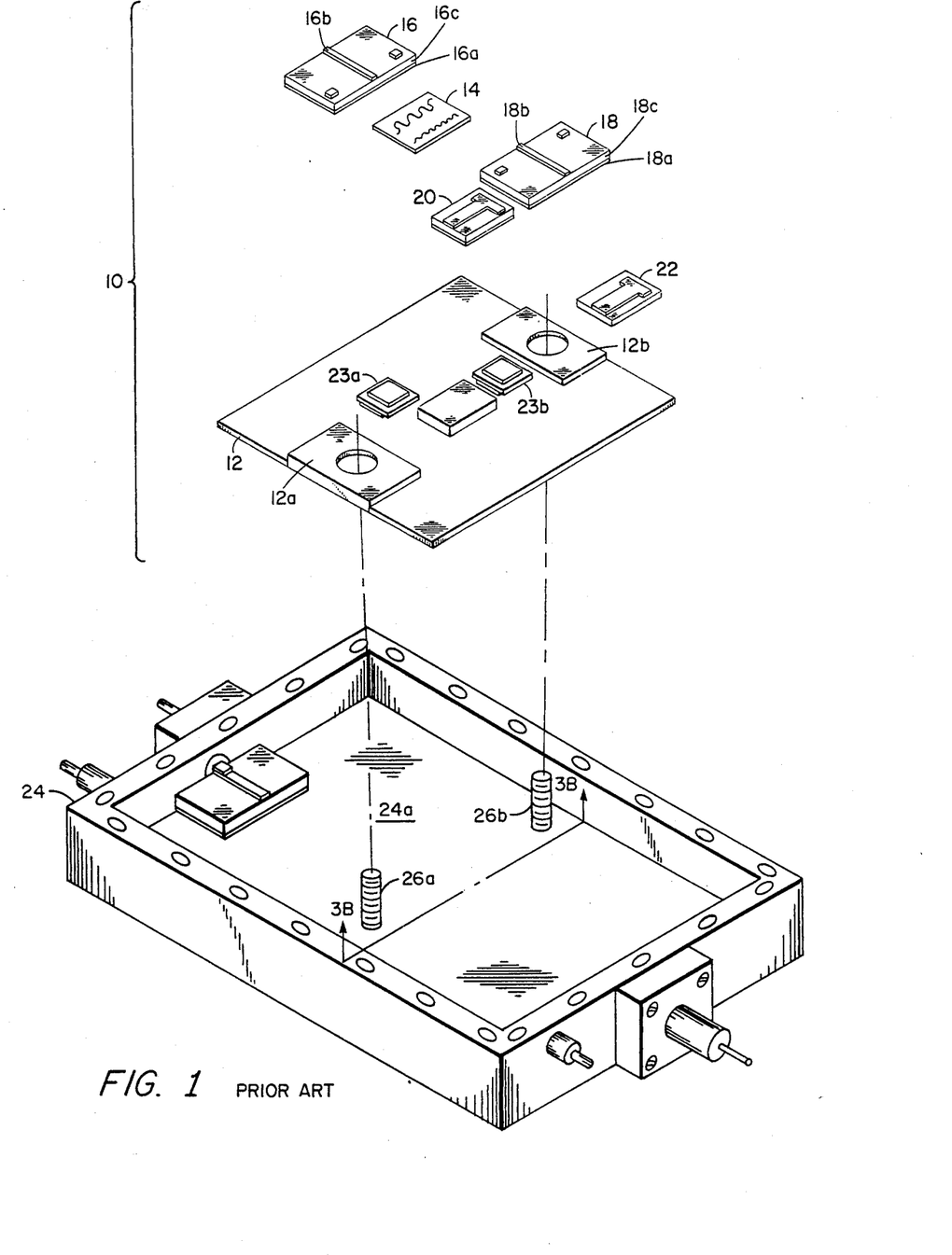
FIG. 1 is an exploded isometric view of a typical machined metal carrier of the prior art, supporting a number of circuit components for here a high power distributed amplifier integrated circuit mounted into a conventional microwave circuit package.

A typical metal carrier 12 for use with a MMIC circuit 10 is shown in FIG. 1. The metal carrier 12 is machined from a slab to here provide support region 12a over which is soldered an MMIC 14, as well as, thick regions 12b and 12c which are used to receive screws or studs for subsequent mounting of the metal carrier 12 into a microwave package 24 as will be described. Bias bonding regions are provided by $Al_2O_3$ dielectric carriers 20 and 22. Input and output transmission lines are also provided by separate dielectric carriers 16 and 18, with each carrier 16, 18 comprised of a layer of here gold which acts as a ground plane conductor 16a, 18a which is spaced from a patterned strip conductor 16b, 18b by a dielectric provided by the aluminum oxide carrier 16c, 18c. Individual chip capacitors 23a, 23b are also mounted on carrier 12. Thus, here the carrier 12 supports six individual components which must be integrated with the MMIC 14 to provide a practical circuit.

There are several problems with the approach shown in FIG. 1. The principal problems concern the relative cost involved with machining the metal carrier 12, as well as, the cost involved in mounting the individual circuit elements 14, 16, 18, 20, 22, 23a, and 23b. Integrated circuit technology is being developed inter alia to reduce the many hand bonding operations commonly employed in hybrid circuit technology. But, with high power devices, due to thermal conductivity considerations, it is necessary to provide the discrete circuit elements as shown on the common metal carrier 12.

There are also several electrical problems associated with this approach. For example, ground planes 14a, 16a, and 18a often are non-planar. This arrangement introduces unwanted parasitics which makes modeling of the circuit more difficult and which can degrade circuit performance. Furthermore, the use of the individual circuit elements typically increases the size of the metal carrier 12.

With the approach shown in FIG. 1, many components in addition to the monolithic microwave integrated circuit 14 are supported on the metal carrier 12. Each of these components must be interconnected by wire bonds to form a practical circuit. The use of additional wire bonds increases the cost of the circuit since wire bonding is a labor intensive operation. Further, a large number of such wire bonds also increases the unpredictability of microwave circuit parasitics.

Problems also arise with packaging of the carrier 12. Typically, the circuit 10 is bonded into the microwave package 24 as also shown in FIG. 1. Although not shown in FIG. 1, many such carriers 12 of the type shown would be disposed in package 24 to provide a microwave assembly. The package 24 shown in FIG. 1 also presents problems. The first problem is that since many of the carriers 12 are used in the package 24, the problem of non-planar ground planes mentioned above is compounded. This increases the complexity of modeling such an arrangement so that parasitics can be reduced or compensated for. Further, the size of the individual carrier 12 is generally large due to mounting of individual circuit components. Mounting of many of such carriers 12 within an individual package will unavoidably increase the size of the package 24. At microwave frequencies, it is undesirable to have the size of the package exceed the waveguide cut-off wavelength of the highest operating frequency of the circuit. If such a threshold is reached, undesired internal wave propagation modes will be created which will interfere with proper microwave performance. Thus, package size also becomes a limiting factor for microwave performance.

Moreover, the carriers 12 are generally bolted into the package 24 by studs 26a, 26b which are impressed into the package base, as is generally known. This arrangement provides the possibility for poor electrical and thermal contact between the bottom portion of the carrier 12 and the base portion 24a of package 24. Further, if excessive, torque is applied to the studs 26a, 26b, the carrier may slightly flex or bend, leaving voids between the surface of the carrier 12 and the base. With sufficient flexing and bending such excessive torque can crack the integrated circuit 14 mounted on the carrier 12 either during assembly or during subsequent thermal cycling or use of the circuit 10.

SUMMARY OF THE INVENTION

In accordance with the present invention, a microwave assembly includes an aluminum nitride substrate having a selected thickness and a pair of opposing surfaces. Disposed over a first one of the pair of opposing surfaces is a ground plane conductor and disposed over the second one of said pair of surfaces is a high power radio frequency circuit having an average thermal dissipation generally greater than about 0.3 watts. With this particular arrangement, by providing a substrate of aluminum nitride which has relatively high thermal conductivity compared to the thermal conductivity of conventionally used aluminum oxide for low power circuits and a thermal conductivity comparable to the conventionally used machine metal carriers in high power circuits, a dielectric carrier approach to high power microwave package sub-assembly is provided. Since the aluminum nitride also has a relatively low dielectric constant (approximately 8.8), microwave circuit components using the substrate as the dielectric may also be fabricated over the second surface of the aluminum nitride substrate. This arrangement, therefore, allows thin film integration circuit techniques to be used on the aluminum nitride substrate which carries the monolithic microwave integrated circuit. This will result in substantial cost savings, as well as, substantial improvement in microwave performance by eliminating many wire bonds, and many hand assembly steps. Moreover, since the aluminum nitride substrate carries the ground plane conductor, the casellated ground plane conductors of the conventional approach are also reduced.

In accordance with a further aspect of the present invention, a packaged radio frequency circuit includes a package comprised of a metal matrix material having a base portion. Disposed over said base portion is a carrier comprised of aluminum nitride, said carrier having a selected thickness and a pair of opposing surfaces with a ground plane conductor disposed over a first one of said surfaces and with said ground plane conductor being bonded to the base of the metal matrix housing. Disposed over said second surface of said aluminum nitride carrier is a patterned central conductor having at least one plated via hole disposed through said aluminum nitride substrate to electrically interconnect the patterned metal layer with the ground plane conductor disposed over the first surface of said aluminum nitride substrate. Disposed on said patterned central conductor is a high power, radio frequency circuit having a thermal dissipation of approximately about 0.3 watts or greater, said substrate having conductive vias disposed to interconnect appropriate portions of the high power circuit to the ground plane conductor. With this particular arrangement, a dielectric carrier is provided in particular for integrated circuits which makes use of efficiencies achieved in integrated circuit technology, since the second surface of the aluminum nitride substrate can act as a support surface for the integrated circuit, as well as, a support surface and a dielectric for components fabricated thereover such as resistors, transmission lines and capacitors. Such a carrier is mounted in a machined metal matrix package which has a thermal conductivity matched to that of the carrier.

BRIEF DESCRIPTION OF THE DRAWINGS

The foregoing features of this invention, as well as the invention itself, may be more fully understood from the following detailed description of the drawings, in which:

FIGS. 3, 4A–4C, and 5 are a series of cross-sectional views showing steps in fabricating the carrier of FIG. 2 where FIG 4C is taken along line 4C—4C of FIG. 2 and FIG. 5 is taken along line 5—5 of FIG. 2;

DESCRIPTION OF THE PREFERRED EMBODIMENTS

Figure 2:
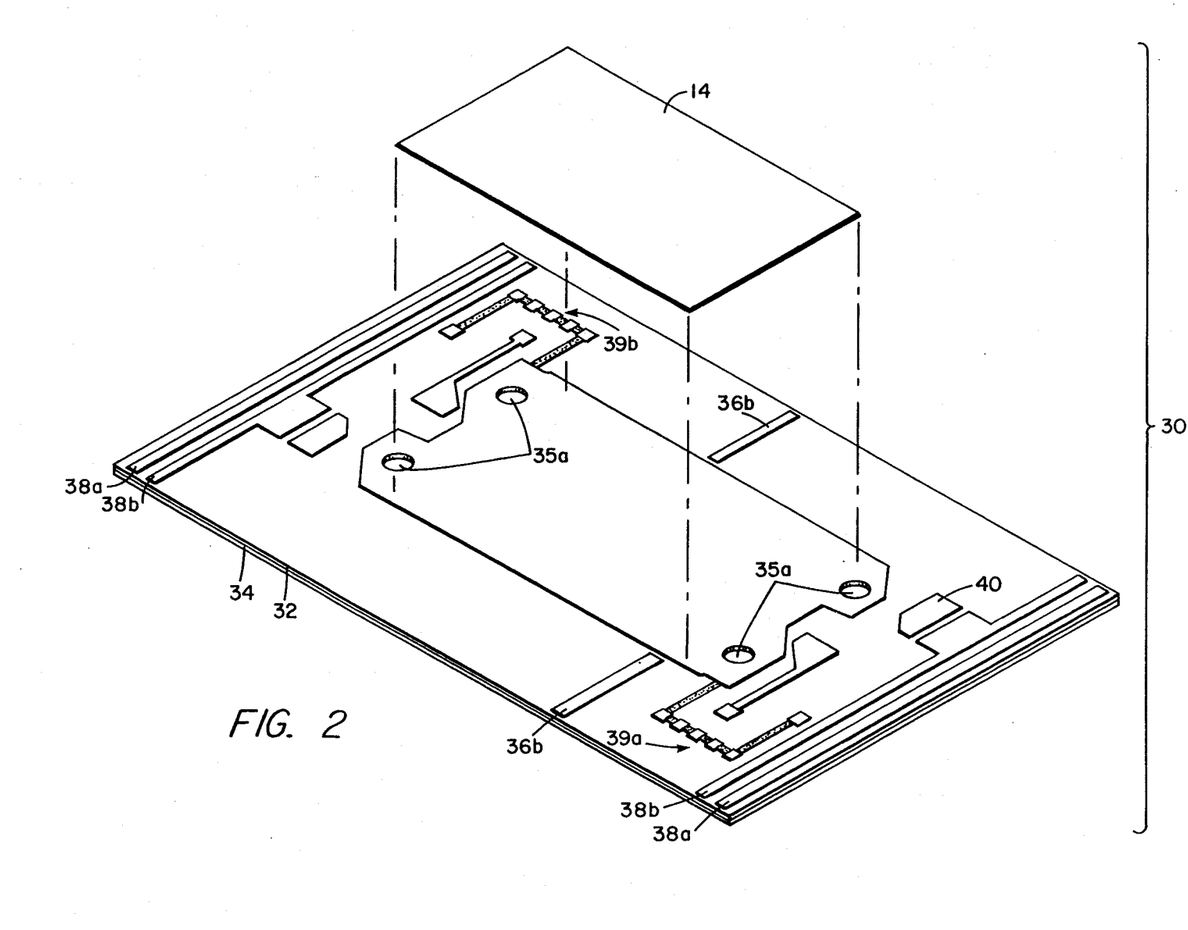
FIG. 2 is an exploded isometric view of a dielectric carrier in accordance with an aspect of the present invention supporting circuit components for the same high power distributed amplifier of FIG. 1.

Referring now to FIG. 2, a dielectric carrier circuit 30 suitable for use with high power dissipation devices such as high power field effect transistors, monolithic microwave integrated circuits and the like is shown to include a substrate slab or carrier 32 comprised of a dielectric material having a suitable dielectric constant in the range of 6 to 10 and a minimum thermal conductivity of about 150–250 W/M-K°. Here preferred examples of said substrate being beryllium oxide (BeO) and in particular aluminum nitride (AlN) due to its very low toxicity to BeO. Disposed over a first surface of said carrier 32 is a ground plane conductor 34 as will be more fully described in conjunction with FIG. 3. Disposed over a second surface of said slab 32 and supported thereover are a central upper ground plane conductor 35 which is coupled to the lower ground plane conductor 34 by plated via holes 35a as will be described in conjunction with FIGS. 4A–4C, an input transmission line 36a and output transmission line 36b as also will be further described in conjunction with FIGS. 4A–4C, and thin film components here resistors 39a, 39b, and 40, supported over the second surface of slab 32 as shown. Each one of said components are integrally formed over said surface, by photolithographic techniques. The microstrip transmission lines 36a, 36b include patterned strip conductor portions 36a', 36b' having a selected width to provide a requisite impedance characteristic. The dielectric for such microstrip transmission lines is provided by the dielectric carrier 32 which supports the circuits thereover, and the ground plane conductor 34 disposed over the opposite surface of the carrier 32. Thus, microstrip lines are formed on the carrier using conventional photolithographic techniques which eliminate expensive hand bonding and mounting operations. Alternatively, other transmission media such as CPW (co-planar waveguide) could also be used. This particular arrangement also permits auxiliary circuit components such as resistors and capacitors as will be described in conjunction with FIGS. 4A–4C and 6 to be formed on the carrier 32 using thin film photolithographic techniques. An MMIC circuit 14 here the same MMIC circuit (i.e. a distributed amplifier) as described in conjunction with FIG. 1 is disposed over and bonded to the central patterned metal layer 35 which acts as a ground plane for the circuit 14. The MMIC 14 is bonded by use of gold-tin solder.

Details of construction of the carrier 32 having a ground plane conductor 34 disposed over a first surface thereof and the passive components i.e. here resistors and microstrip transmission line sections disposed over a second opposite surface thereof will now be described in conjunction with FIGS. 3, 4A–4C, and 5.

Figure 3:
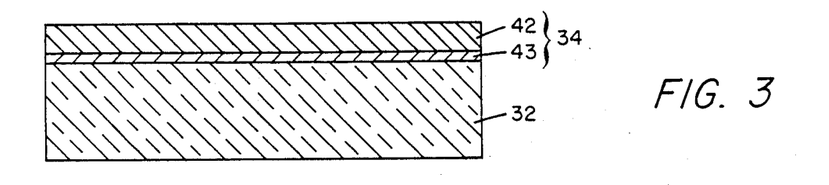

Referring first to FIG. 3, the carrier 32 of dielectric is here shown to include an adherent layer 43 comprised of an alloy of titanium-tungsten (TiW) in approximate ratio of 10% titanium 90% tungsten having a thickness of 200–300 Å. Disposed over layer 43 is a conductive layer of gold 42 having a thickness typically of about 0.2 mils. Layer 43 acts as an adhesion layer for the layer of gold 42 disposed thereover. Layers 42 and 43 in combination, therefore, provide the ground plane conductor 34 as described in conjunction with FIGS. 4A-4C.

Figure 4A:
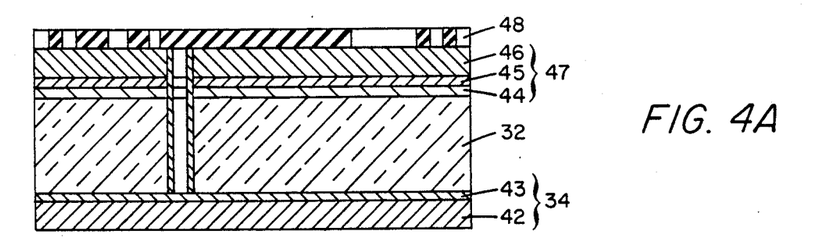
Figure 4B:
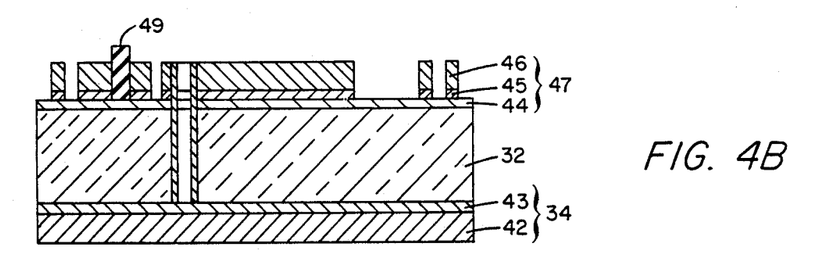
Figure 4C:
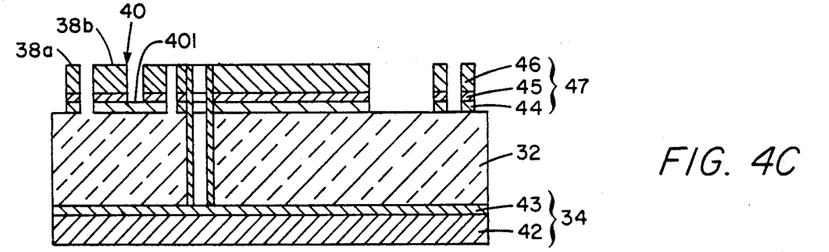

Referring now to FIGS. 4A-4C taken alone lines 4—4 of FIG. 2 steps in the fabrication of the central ground metalization 35, input and output strip conductors 36a, 36b, D.C. bias lines 38a, 38b and resistors 40 will now be described.

Referring first to FIG. 4A, slab 32 having ground plane conductor 34 disposed over a first surface thereof and a plated via hole disposed therethrough has disposed over a second opposite surface thereof composite layer 47 comprised of a high resistivity metal 44 of here tantalum nitride. The plated via hole is conventionally formed, here by laser drilling but alternately by other techniques, such as mechanical drilling or masking and chemical etching. The tantalum nitride is heat treatable to a resistivity of 50 $\Omega$- sq. Disposed over the resistivity layer 44 is an adherent layer 45 here comprised of titanium tungsten having a thickness in the range of 200 Å to 300 Å, and a composition ratio of 10% titanium to 90% tungsten. A conductive layer 46 here of gold having a thickness of 0.18 mils to 0.22 mils is disposed over the adherent layer 45. Gold layer 46 has disposed thereover a patterned mask layer 48 here comprised of a resist. The mask layer 48 is suitably patterned using conventional photolithographic masking and etching techniques to expose underlying portions of the gold layer 46 and regions thereof not covered by one of the aforementioned passive components and conductors.

As shown in FIG. 4B, the pattern in layer 48 is transferred through the gold layer and through underlying titanium tungsten layer 45 using conventional etchants.

After the pattern provided in mask layer 48 is transferred through the gold and titanium-tungsten layers 46, 45, the tantalum nitride layer 44 is etched away in all regions not covered by the metal layers 45, 46 and regions which are not intended to provide resistor elements. Here, therefore, a second layer of resist (not shown) is patterned to provide here a region 49 which covers the portions of the tantalum nitride layer 44 which will form part of the thin film resistor elements (i.e. 40).

As shown in FIG. 4C, the unmasked portions of layer 44 are also etched away and the resist layer 49 is removed leaving behind exposed portion 40' which are connected to the adjacent conductive layers (not numbered) to provide a resistor element 40. Also provided are lines 38a, 38b and central conductor 35.

Figure 5:
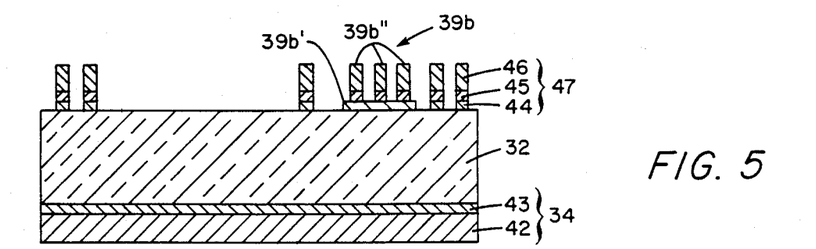

Referring now to FIG. 5 taken along line 5—5 of FIG. 2, resistor element 39b and strip conductor 36b, as well as, the pair of bias lines 38a, 38b are shown disposed over second surface of slab 32. Fabrication of this portion of the circuit is in general identical to and occurs concurrently with that described above. FIG. 5 particularly shows construction of resistor 39b and by inference the construction of resistor 39a. Resistor 39b has a meandered resistive portion 39b' disposed on the substrate (as shown in FIG. 2) and spaced electrical contact portions 39b" (FIGS. 2 and 5). The contacts 39b" are used to provide an adjustable resistive divider section. Resistor contacts 39b" and resistance portion 39b' are provided by etching layers 45, and 46 and layer 44 as generally described above.

Figure 6:
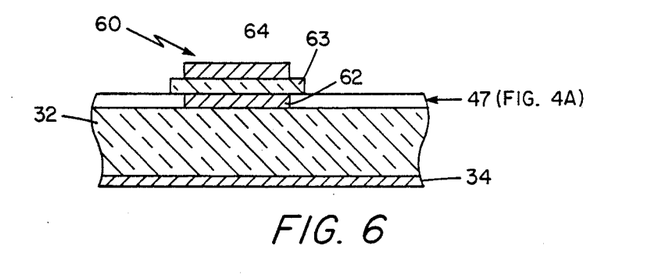
FIG. 6 is a cross-sectional view of a capacitor fabricated in accordance with a further aspect of the present invention.

Referring now to FIG. 6, a capacitor 60 is shown supported on carrier 32. The capacitor is not used in the circuit 30 of FIG. 2 but may be provided for other circuits requiring such a capacitor. Capacitor 60 is provided by first providing a patterned bottom contact 62 from selective etching of layers 44, 45, and 46 as described above. A dielectric layer 63 is selectively deposited over bottom contact 62. Suitable dielectrics include $Si_3N_4$ for low value capacitors or $Ta_2O_5$ for high value capacitors. A top contact 64 is then provided over dielectric 63 as shown. A via hole (not shown) may be provided under capacitor 60 to couple the bottom contact 62 to ground. The bottom contact 62 may also be patterned to provide a strip portion (not shown) extending beyond the dielectric 63 to permit the bottom contact to be coupled to the components supported on the carrier. A wire bond (not shown) is generally used to connect the top contact to other components.

Figure 7:
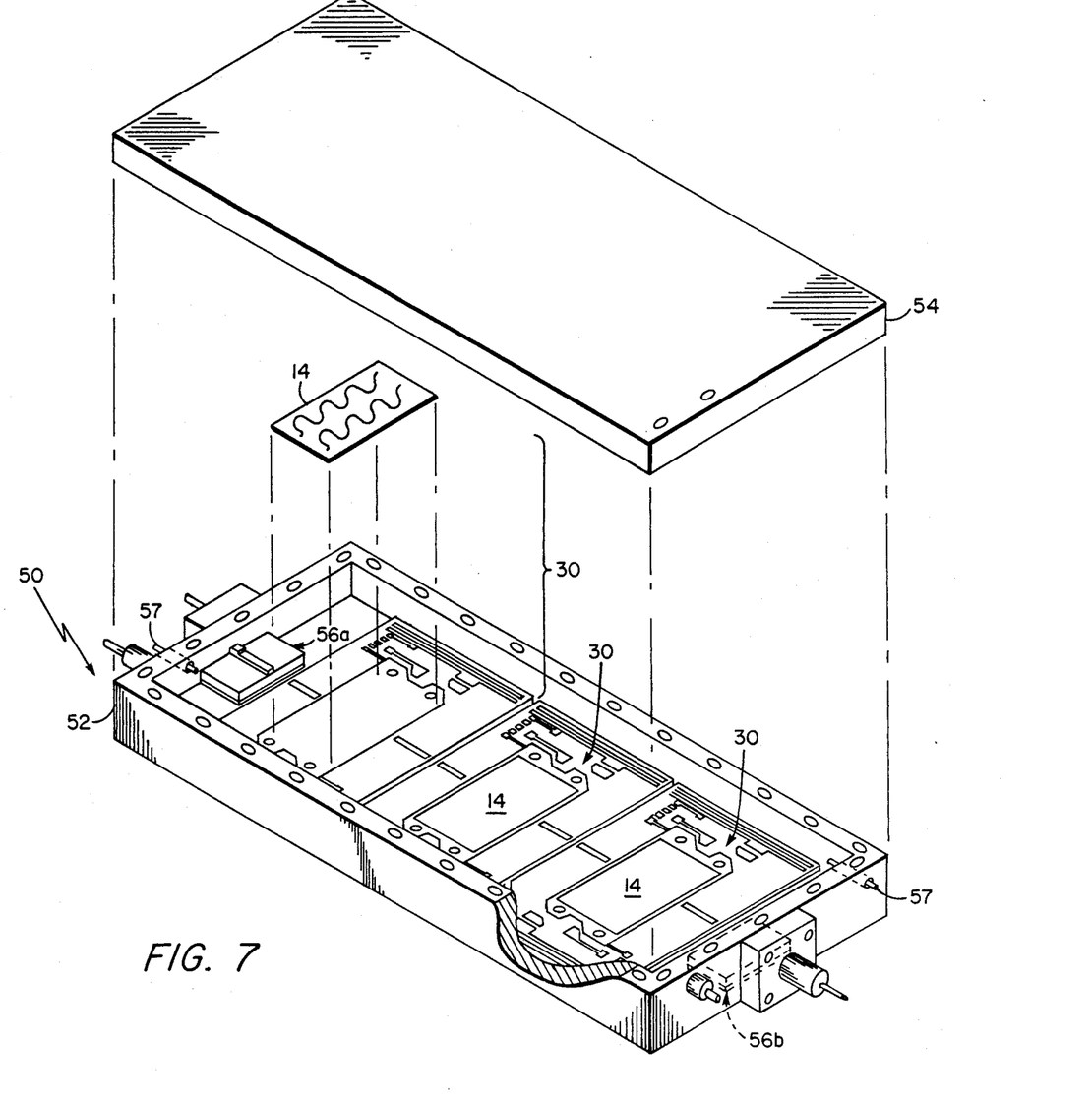
FIG. 7 is an exploded isometric view showing the carrier of FIG. 2 disposed in a microwave package in accordance with a further aspect of the present invention.

Referring now to FIG. 7, a microwave package 50 is here shown to include three microwave circuits disposed on aluminum nitride carriers 30 fabricated as generally described in conjunction with FIG. 2. Package 50 includes a base portion 52 here said base portion 52 comprised of a metal matrix material. Here said metal matrix material being silicon carbide and aluminum, where aluminum is the metal matrix. The silicon carbide and aluminum are provided in powdered form and are fired and densified using conventional techniques to provide a composite material having thermal expansion characteristics substantially matched to that of the aluminum nitride material. Such material may be obtained from DWA Composite Specialties, Inc., Chatsworth Calif., type 40V/OSiCp/A1. The package 50 further includes an input and output pair of microstrip transmission lines 56a, 56b fabricated on alumina or Duroid as are conventionally used. The package further includes dielectrically insulated bias feedthroughs 57 which are connected by wire bonds to the respective bias lines 38a, 38b disposed on the carriers 30 as described previously. Wire ribbon bonds (not shown) are used to couple the input/output transmission line elements 56a, 56b to respectively the input of the first one of the elements 30 and the output of the last one of the elements 30 as would now be recognized. Cover 54 here also of a metal matrix material is secured to the base 52 via screws (not shown) or other suitable means.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A packaged radio frequency circuit comprising:
    a package comprising:
    a base comprised of a metal matrix material;
    a microwave circuit carrier disposed on said base of said package, said carrier comprising:
    an aluminum nitride carrier having a selected thickness and a pair of opposing surfaces;
    a ground plane conductor disposed over a first one of said surfaces;
    a patterned conductive layer disposed directly on a second opposite one of said surfaces, electrically connected to said ground plane conductor through at least one plated via hole disposed through said aluminum nitride carrier;
    a thin film resistor formed on the second opposite one of said surfaces, including a layer of high resistivity material disposed on the second opposite one of said surfaces and a pair of spaced electrical contacts, each contact comprised of an adherent conductive layer disposed on a portion of the high resistivity layer and a layer of conductive material disposed on said adherent layer;

a first strip conductor formed on the second opposite one of said surfaces, with said first strip conductor, said substrate, and said ground plane conductor providing a microstrip transmission line;

a plurality of D.C. bias lines each comprised of a second strip conductor disposed on and along peripheral portions of the second opposite one of said surfaces and comprised of a layer of high resistivity material disposed on the second opposite one of said surfaces, an adherent conductive layer disposed thereon, and a layer of conductive material disposed on said adherent conductive layer; and a high power radio frequency circuit supported on the second opposite one of said surfaces of said aluminum nitride carrier and disposed directly on said patterned conductive layer, said circuit having an average thermal dissipation of at least about 0.3 watts.

2. The circuit of claim 1 further comprising at least one passive component supported on said carrier.

3. The circuit of claim 1 wherein the metal matrix material is silicon carbide in a metal matrix of aluminum.

4. A microwave circuit carrier comprising:

a dielectric substrate having a selected thickness and a pair of opposing surfaces, the material of said substrate having a dielectric constant less than about 10 and a thermal conductivity of at least 150 W/M-K°;

a ground plane conductor disposed over a first one of said surfaces;

a patterned composite metal layer disposed over a second opposite one of said surfaces electrically connected to said ground plane conductor through at least one plated via hole disposed through said dielectric substrate, and comprised of: a layer of high resistivity material disposed on the second opposite one of said surfaces, an adherent conductive layer disposed thereon, and a layer of conductive material disposed on said adherent layer;

a thin film resistor formed on the second opposite one of said surfaces, including a layer of a high resistivity material disposed on the second opposite one of said surfaces and a pair of spaced electrical contacts each contact comprised of an adherent conductive layer disposed on a portion of the high resistivity layer and a layer of conductive material disposed on said adherent layer;

a first strip conductor formed on the second opposite one of said surfaces, with said first strip conductor, said substrate, and said ground plane conductor providing a microstrip transmission line; and a plurality of DC bias lines each comprised of a second strip conductor disposed on and along peripheral portions of the second opposite one of said surfaces and comprised of a layer of high resistivity material disposed on the second opposite one of said surfaces, an adherent conductive layer disposed thereon, and a layer of conductive material disposed on said adherent conductive layer.

5. The circuit carrier of claim 4 further comprising a thin film capacitor supported on the second opposite one of said surfaces, with a first plate of said capacitor comprising a layer of high resistivity material disposed on the second opposite one of said surfaces, an adherent layer disposed thereon, and a layer of conductive material disposed on said adherent layer.

6. The carrier circuit of claim 4 further comprising a radio frequency circuit disposed on said patterned metal layer.

7. The microwave circuit of claim 4 wherein said dielectric substrate is aluminum nitride.

8. The microwave circuit carrier of claim 7 wherein the microwave circuit carrier further comprises a radio frequency circuit supported on the second opposite one of said surfaces of said substrate and disposed over said patterned metal layer, said circuit having an average thermal dissipation of at least about 0.3 watts.

* * * * *

UNITED STATES PATENT AND TRADEMARK OFFICE
CERTIFICATE OF CORRECTION

PATENT NO.  : 4,951,014

DATED       : August 21, 1990

INVENTOR(S) : Albert C. Wohlert, H. Barteld Van Rees

It is certified that error appears in the above-identified patent and that said Letters Patent is hereby corrected as shown below:

Sheets 1, 2, and 3 of the drawings should be deleted and substituted with the attached sheets of drawings therefor. The title page should be deleted and should appear as per attachment.

Signed and Sealed this

Fifteenth Day of October, 1991

*Attest:*

HARRY F. MANBECK, JR.

*Attesting Officer*   *Commissioner of Patents and Trademarks*

United States Patent [19]
Wohlert et al.

[11] Patent Number: 4,951,014
[45] Date of Patent: Aug. 21, 1990

[54] HIGH POWER MICROWAVE CIRCUIT PACKAGES

[75] Inventors: Albert C. Wohlert, Townsend; H. Barteld Van Rees, Newton Upper Falls, both of Mass.

[73] Assignee: Raytheon Company, Lexington, Mass.

[21] Appl. No.: 358,279

[22] Filed: May 26, 1989

[51] Int. Cl.$^5$ .............................................. H01P 1/00
[52] U.S. Cl. ..................................... 333/246; 333/247
[58] Field of Search ................... 333/246, 247; 357/75, 357/81

[56] References Cited

U.S. PATENT DOCUMENTS

| | | | |
|---|---|---|---|
| 3,825,805 | 7/1974 | Belohoubeck et al. | 333/247 X |
| 3,943,556 | 3/1976 | Wilson | 333/247 X |
| 3,958,195 | 5/1976 | Johnson | 333/247 |
| 4,617,586 | 10/1986 | Cuvilliers et al. | 333/247 X |
| 4,835,065 | 5/1989 | Sato et al. | 357/67 X |

*Primary Examiner*—Paul Gensler
*Attorney, Agent, or Firm*—Denis G. Maloney; Richard M. Sharkansky

[57] ABSTRACT

A carrier for high power solid state devices in particular monolithic microwave integrated gallium arsenide circuits includes a dielectric carrier surface comprised of aluminum nitride having disposed over a first surface thereof, a plated ground plane conductor and having disposed over a second surface thereof a ground plane conductor disposed in selected regions of said second surface, connected to the underlying ground plane conductor by via holes. The aluminum nitride carrier provides a dielectric for transmission lines which are supported by said carrier, and a support for resistor and capacitor devices formed over said carrier by thin film techniques. A high power active device such as a FET or gallium arsenide MMIC is bonded to the selective ground plane regions of the second surface of the aluminum nitride carrier. With this approach, a separate metal carrier having separately mounted components such as resistors, capacitors, and transmission lines is eliminated. The techniqu provides improvement in thermal resistance characteristics of the microwave circuit supported by the carrier and simplifies the packaging of such devices.

8 Claims, 4 Drawing Sheets